United States Patent [19]

Torii

[11] Patent Number: 5,744,427
[45] Date of Patent: Apr. 28, 1998

[54] THALLIUM OXIDE SUPERCONDUCTOR AND METHOD OF PREPARING THE SAME

[75] Inventor: Yasuko Torii, Osaka, Japan

[73] Assignee: Sumitomo Electric Industries, Ltd., Japan

[21] Appl. No.: 232,847

[22] Filed: Apr. 25, 1994

Related U.S. Application Data

[63] Continuation of Ser. No. 43,131, Jan. 11, 1993, abandoned, which is a continuation of Ser. No. 675,212, Mar. 26, 1991, abandoned.

[30] Foreign Application Priority Data

| Mar. 26, 1990 | [JP] | Japan | 2-77463 |
| Mar. 26, 1990 | [JP] | Japan | 2-77464 |
| Mar. 26, 1990 | [JP] | Japan | 2-77465 |
| Mar. 26, 1990 | [JP] | Japan | 2-77466 |
| Mar. 27, 1990 | [JP] | Japan | 2-80419 |
| Mar. 27, 1990 | [JP] | Japan | 2-80420 |
| Mar. 27, 1990 | [JP] | Japan | 2-80422 |

[51] Int. Cl.$^6$ .................................................. H01L 39/24
[52] U.S. Cl. .................. 505/433; 29/599; 505/492; 505/501; 505/928; 505/930; 505/740
[58] Field of Search ..................... 505/492, 501, 505/430, 432, 433, 500, 740, 928, 930; 29/599

[56] References Cited

U.S. PATENT DOCUMENTS

| 4,952,554 | 8/1990 | Jin et al. | 505/1 |
| 4,956,336 | 9/1990 | Salama et al. | 505/500 X |
| 4,990,488 | 2/1991 | von Schnering et al. | 505/1 |
| 5,100,865 | 3/1992 | Yamamoto et al. | 29/599 X |
| 5,155,092 | 10/1992 | Mizuno et al. | 505/500 X |
| 5,202,308 | 4/1993 | Yamamoto et al. | 29/599 X |
| 5,204,316 | 4/1993 | Arendt et al. | 505/432 |
| 5,232,906 | 8/1993 | Yamamoto et al. | 29/599 X |
| 5,304,602 | 4/1994 | Yamamoto et al. | 29/599 X |
| 5,409,890 | 4/1995 | Yamamoto et al. | 29/599 X |
| 5,424,282 | 6/1995 | Yamamoto et al. | 505/430 X |

FOREIGN PATENT DOCUMENTS

| A2-0 358 545 | 3/1990 | European Pat. Off. . |
| A1-0 377 359 | 7/1990 | European Pat. Off. . |
| A2-26 831 | 1/1990 | Japan . |

*Primary Examiner*—Joseph M. Gorski
*Attorney, Agent, or Firm*—Pennie & Edmonds LLP

[57] ABSTRACT

In a method of preparing a thallium oxide superconductor having components of Tl-Bi-Ca-Sr-Cu-O or Tl-Bi-Pb-Ca-Sr-Cu-O from raw material powder, the raw material powder is subjected to first heat treatment, then exposed to a compressive load, and thereafter subjected to second heat treatment. Thus, a thallium oxide superconductor having a high critical current density can be obtained.

13 Claims, No Drawings

THALLIUM OXIDE SUPERCONDUCTOR AND METHOD OF PREPARING THE SAME

This application is a continuation of U.S. application Ser. No. 08/043,131, filed on Jan. 11, 1993 and now abandoned, which is a continuation of U.S. application Ser. No. 07/675,212, filed on Mar. 26, 1991 and now abandoned.

BACKGROUND OF THE INVENTION

1. Field of the Invention

The present invention relates to a method of preparing a thallium oxide superconductor, and more particularly, it relates to improvement for critical current density in such a superconductor.

2. Description of the Background Art

In recent years, superconductive materials of ceramics, i.e., oxide superconductive materials, are watched as materials which exhibit higher critical temperatures.

Among such oxide superconductive materials, those of yttrium, bismuth and thallium, which exhibit high critical temperatures of about 90 K, 110 K and 120 K respectively, are expected as practicable materials. In particular, the thallium oxide superconductive material showing the highest critical temperature is watched with interest.

In order to prepare a long superconducting wire from a thallium oxide superconductive material, for example, raw material powder for a thallium oxide superconductor is covered with a metal sheath and shaped into a desired configuration by deformation processing, and thereafter subjected to heat treatment, to be brought into a superconducting state.

The inventor has repeated experiments for preparing such a thallium oxide superconductor, and found preferable conditions for obtaining a thallium oxide superconductor having excellent properties, such as a high critical current density, for example, in relation to heat treatment as well as combination of such heat treatment with deformation processing.

SUMMARY OF THE INVENTION

Accordingly, an object of the present invention is to provide a method of preparing a thallium oxide superconductor, which can provide a high critical current density, on the basis of the aforementioned recognition.

The present invention is directed to a method of preparing a thallium oxide superconductor having components of Tl-Bi-Ca-Sr-Cu-O or Tl-Bi-Pb-Ca-Sr-Cu-O. In order to attain the aforementioned object, the present invention is characterized in that the aforementioned raw material powder is subjected to first heat treatment, thereafter exposed to a compressive load, and then subjected to second heat treatment. The raw material may be prepared by a mixture of oxides and/or carbonates containing each element, or by a superconductor obtained by heat treating the mixture of oxides and/or carbonates.

The compressive load is applied to the raw material powder through a step of performing rolling or pressing. When the inventive method is carried out on raw material powder which is covered with a metal sheath in order to obtain a superconducting wire, for example, a compressive load is applied to the raw material powder in a step of performing deformation processing such as rolling, pressing or drawing on the metal sheath covering the raw material powder.

In the method according to the present invention, singularization of a target superconducting phase is promoted by the first heat treatment and the structure of the superconductor is improved in denseness in the next step of applying a compressive load, while growth of crystal grains is facilitated by the second heat treatment.

In the thallium oxide superconductor obtained according to the present invention, therefore, the target superconducting phase is formed in a large quantity with a dense structure, and crystal grains can be favorably joined to one another by growth of crystal grains. Thus, it is possible to obtain a thallium oxide superconductor which has a high critical current density, to increase the possibility of practical application to a cable or a magnet.

It has been recognized that the critical current density is further effectively improved when a temperature given in the first heat treatment is higher than that given in the second heat treatment.

Particularly when the temperature given in the first heat treatment is 800° to 920° C. and that given in the second heat treatment is 750° to 870° C., the critical current density is effectively improved.

When the raw material powder is covered with a metal sheath, it is easy to shape the as-formed thallium oxide superconductor into a desired configuration. For example, a long superconducting wire can be easily obtained through a long tubular metal sheath.

When the various steps are carried out on raw material powder which is covered with a metal sheath as described above, a thallium oxide superconductor having stable and excellent properties is obtained under the following preferable conditions:

(1) The temperature given in the first heat treatment is 700 to 900° C.

(2) After the step of applying a compressive load, the thickness of a raw material powder portion occupies 20 to 80% of that of the overall composite formed by the metal sheath and the raw material powder.

(3) The temperature T [°C.] given in the second heat treatment is so selected as to satisfy the following equation:

$$T = 840 + A \times W - 10t$$

where $700 < T < 880$, $600 \leq A \leq 100$, W represents the thickness [mm] of the overall composite formed by the metal sheath and the raw material powder, and t represents the time [h.] for the second heat treatment.

The metal sheath is preferably formed of a material such as gold, a gold alloy, silver or a silver alloy, which is not reactive with the superconductive material during the heat treatment. Since such a metal material has high conductivity, the metal sheath can also serve as a stabilizer.

When the metal sheath has a composite structure of an inner peripheral surface which is formed by a noble metal layer of gold, a gold alloy, silver or a silver alloy and an outer layer of a strong metal such as stainless steel or nickel, the strong metal layer reinforces the noble metal layer in strength. Therefore, the metal sheath can withstand a high draft as a whole, whereby improvement of the critical current density can be expected following such increase of the draft. Further, the metal sheath of such a composite structure can effectively prevent evaporation of thallium during heat treatment, whereby the composition of the thallium oxide superconductor can be easily controlled. Improvement of the critical current density can be expected also in this point.

When the composite of the metal sheath and the raw material powder is reduced in section in the step of applying a compressive load or the like, it is possible to improve the structure of the superconductor in denseness by reducing the sectional area of the raw material powder portion to be not more than 1/1.5 of that before such reduction, and reaction of the target superconducting phase can be prompted. Consequently, it is possible to obtain a thallium oxide superconductor which has a high critical current density.

When the composite is cooled at a temperature reducing speed of at least 20° C./min. after the step of performing first heat treatment, it is possible to suppress formation of a foreign phase and adsorption of excessive gas.

When the compressive load is selected to be at least 5 t/cm$^2$ in the step of applying a compressive load, it is possible to improve the structure of the as-formed thallium oxide superconductor in denseness, as well as to facilitate reaction of the target superconducting phase. Even if a load exceeding 100 t/cm$^2$ is applied, densification of the structure and the speed of reaction are substantially saturated.

When the thickness of the as-formed thallium oxide superconductor is not more than 200 μm, formation of the target superconducting phase is homogeneously promoted entirely over the superconductor, whereby the superconductor can be easily singularized in phase. Therefore, it is possible to effectuate the critical current density, which is essentially provided in the thallium oxide superconductor, to the maximum. When the superconductor has a flat sectional configuration such as that of a tape, the term "thickness of the thallium oxide superconductor" indicates the cross-directional size along the shorter section. When the superconductor has a circular section, on the other hand, the above term indicates the length of the diameter.

DESCRIPTION OF THE PREFERRED EMBODIMENTS

A thallium oxide superconductor to be prepared by the present invention has the components of:

(1) Tl-Bi-Ca-Sr-Cu-O; or (2) Tl-Bi-Pb-Ca-Sr-Cu-O

A thallium oxide superconductor having the components of (1) is obtained by heat treating raw material powder having the following blending/composition:

$(Tl_{1-x}Bi_x)_a Sr_b Ca_m Cu_n$ where 0<x<1, 0.5<a<2, 0.5<a<2, 0.5<b<3, 0.5<m<5 and 2<n, for example, in an atmosphere containing oxygen.

In the above blending/composition, it is preferable to further satisfy a condition of 0<x<0.6.

A thallium oxide superconductor having the components of (2) is obtained by heat treating raw material powder having the following blending/composition:

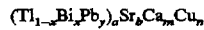

$(Tl_{1-x}Bi_x Pb_y)_a Sr_b Ca_m Cu_n$ where 0<x<1, 0<y<1, 0.5<a<2, 0.5<b<3, 0.5<m<5 and 2<n, for example, in an atmosphere containing oxygen.

In the above blending/composition, it is preferable to further satisfy conditions of 0<x<0.6 and 0<y<0.5.

Experimental Examples of the present invention are now described.

EXPERIMENTAL EXAMPLE 1

Powder materials of $SrCO_3$, $CaCO_3$ and CuO were weighed, mixed with each other, pelletized and thereafter fired at 750° to 840° C. for 24 hours. The sintered pellet was pulverized, and (1) powder materials of $Tl_2O_3$ and $Bi_2O_3$ were weighed and added to the pulverized pellet so that Tl, Bi, Ca, Sr and Cu were finally in compound ratios of 1.6:0.4:2:2:3, to prepare a sample 1, and (2) $Tl_2O_3$, $Bi_2O_3$ and PbO were weighed and added to the pellet so that Tl, Bi, Pb, Ca, Sr and Cu were finally in compounding ratios of 1.5:0.3:0.2:2:2:3, to prepare a sample 2.

The powder samples 1 and 2 were further fired, to obtain sintered pellets.

The sintered pellets were pulverized and filled up in silver sheaths, and thereafter worked into tapes.

The tapes were subjected to first heat treatment under conditions shown in Table 1, thereafter exposed to loads of 5 to 100 t/cm$^2$ with a press, and then subjected to second heat treatment under conditions shown in Table 1.

TABLE 1

| Heat Treatment Condition No. | 1st Heat Treatment Temperature × Time (°C.) (h.) | 2nd Heat Treatment Temperature × Time (°C.) (h.) |
|---|---|---|
| 1 | 880 × 1 | 860 × 4 |
| 2 | 880 × 1 | 840 × 4 |
| 3 | 880 × 1 | 820 × 4 |
| 4 | 880 × 1 | 780 × 4 |
| 5* | 880 × 1 | 880 × 4 |
| 6* | 880 × 1 | 700 × 4 |
| 7* | 780 × 1 | 840 × 4 |
| 8* | 930 × 1 | 840 × 4 |
| 9* | 880 × 1 | — |
| 10* | 860 × 1 | — |

The as-formed wires of the samples 1 and 2 were subjected to measurement of critical current densities at the liquid nitrogen temperature. Table 2 shows the results.

TABLE 2

| Heat Treatment Condition No. | Critical Current Density (A/cm$^2$) | |
|---|---|---|
| | Sample 1 | Sample 2 |
| 1 | 12000 | 10000 |
| 2 | 15000 | 12000 |
| 3 | 12000 | 10000 |
| 4 | 10000 | 7500 |
| 5* | 4000 | 2000 |
| 6* | 5500 | 4000 |
| 7* | 7500 | 5000 |
| 8* | 3500 | 2000 |
| 9* | 4000 | 2500 |
| 10* | 5500 | 2000 |

Referring to Tables 1 and 2, those heat treated under the conditions 5* to 10* are comparative samples.

Effects of the press working performed between the first heat treatment and the second heat treatment were confirmed.

Table 3 shows samples which were heat treated under the conditions Nos. 1 to 5 shown in Table 1 but subjected to no press working between the first heat treatment and the second heat treatment.

TABLE 3

| Heat Treatment Condition No. | Critical Current Density (A/cm$^2$) | |
|---|---|---|
| | Sample 1 | Sample 2 |
| 1 | 7000 | 6000 |
| 2 | 9000 | 8000 |

TABLE 3-continued

| Heat Treatment | Critical Current Density (A/cm$^2$) | |
| --- | --- | --- |
| Condition No. | Sample 1 | Sample 2 |
| 3 | 7500 | 6500 |
| 4 | 6000 | 3500 |
| 5* | 2000 | 1000 |

Comparing Table 3 with the heat treatment conditions Nos. 1 to 5 shown in Table 2, it is understood that the press working performed between the first heat treatment and the second heat treatment contributed to improvement of the critical current densities.

EXPERIMENTAL EXAMPLE 2

Raw material powder samples obtained similarly to Experimental Example 1 were filled up in silver sheaths, and thereafter worked into tapes.

The as-formed tapes were subjected to first heat treatment at 880° C. for one hour.

Then the tapes were pressed with various loads, to obtain various tape-type wires having thicknesses W [mm] shown in Table 4. In every sample, the thickness of a raw material portion was within a range of 20 to 80% of the thickness W of the overall wire.

Then the samples were subjected to second heat treatment under conditions shown in the columns of "heat treatment temperature (°C.)" and "heat treatment time (h.)" in Table 4.

After the heat treatment, the samples were subjected to measurement of critical current densities in liquid nitrogen. Table 4 also shows the results.

TABLE 4

| Thickness of Wire (W) | Heat Treatment Temperature (°C.) | Heat Treatment Time (h.) | Critical Current Density (A/cm$^2$) | |
| --- | --- | --- | --- | --- |
| | | | Sample 1 | Sample 2 |
| 0.03 | 805 | 6 | 10000 | 9000 |
| 0.03 | 845 | 2 | 11000 | 11500 |
| *0.03 | 855 | 2 | 5000 | 3000 |
| *0.03 | 835 | 2 | 3000 | 3000 |
| 0.05 | 820 | 6 | 10000 | 9000 |
| 0.05 | 840 | 4 | 15000 | 10500 |
| 0.05 | 860 | 2 | 12000 | 9800 |
| *0.05 | 860 | 4 | 5000 | 3500 |
| 0.05 | 840 | 8 | 6000 | 4600 |
| 0.10 | 860 | 6 | 10000 | 9500 |
| *0.10 | 890 | 6 | 3000 | 2500 |
| 0.10 | 840 | 8 | 12000 | 11000 |
| *0.10 | 840 | 5 | 6000 | 3500 |
| *0.10 | 820 | 6 | 4000 | 2500 |

Referring to Table 4, samples shown with marks * are comparative examples, which do not satisfy the aforementioned equation of T=840+A×W−10t.

On the other hand, it is understood that the samples satisfying the condition of the above equation attained high critical current densities.

EXPERIMENTAL EXAMPLE 3

Sintered powder samples obtained similarly to Experimental Example 1 were filled up in silver sheaths, and thereafter worked into tapes.

Then, first heat treatment was performed at 880° C. for one hour. Thereafter the samples were cooled at various temperature reducing speeds shown in Table 5. Then, the samples were worked with a press of 50 t/cm$^2$, and subjected to second heat treatment at 840° C. for 4 hours.

The as-formed thallium oxide superconducting wires were subjected to measurement of critical current densities in liquid nitrogen. Table 5 also shows the results.

TABLE 5

| Temperature Reducing Speed (°C./min.) | Critical Current Density (A/cm$^2$) | |
| --- | --- | --- |
| | Sample 1 | Sample 2 |
| 200 | 15000 | 12000 |
| 100 | 12000 | 10000 |
| 50 | 5000 | 3500 |
| 10 | 500 | 200 |

It is understood from Table 5 that the critical current densities were remarkably improved when the temperature reducing speeds were at least 20° C./min.

When no second heat treatment was carried out, all samples exhibited critical current densities of 0 A/cm$^2$ in liquid nitrogen, regardless of temperature reducing speeds.

EXPERIMENTAL EXAMPLE 4

The sintered powder obtained from the sample 1 in Experimental Example 1 was filled up in silver pipes, and thereafter worked into tapes.

Then, the samples were exposed to loads shown in Table 6 with various presses, again heat treated, and then subjected to measurement of critical current densities in liquid nitrogen. Table 6 also shows the results.

TABLE 6

| Press Load (t/cm$^2$) | Critical Current Density (A/cm$^2$) |
| --- | --- |
| 0 | 400 |
| 10 | 6000 |
| 20 | 12000 |
| 40 | 14000 |
| 60 | 15000 |
| 80 | 14000 |
| 100 | 14000 |
| 120 | 13500 |

Further, tape-type wires were obtained in a similar manner to the above, except for that the sample 2 of Experimental Example 1 was employed. Table 7 shows critical current densities of the as-formed tape-type wires in liquid nitrogen.

TABLE 7

| Press Load (t/cm$^2$) | Critical Current Density (A/cm$^2$) |
| --- | --- |
| 0 | 200 |
| 10 | 4000 |
| 20 | 9500 |
| 40 | 10000 |
| 60 | 12000 |
| 80 | 12000 |
| 100 | 10500 |
| 120 | 11000 |

It is understood from Tables 6 and 7 that the critical current densities of the superconducting wires were improved when compressive loads of at least 5 t/cm$^2$ were applied. It is also understood that improvement of the critical current densities was substantially saturated when loads exceeding 100 t/cm² were applied.

EXPERIMENTAL EXAMPLE 5

A sintered pellet was obtained from the sample 1 in Experimental Example 1.

The sintered pellet was pulverized into powder, then filled up in a silver pipe, and thereafter subjected to sectional reduction on the basis of rolling. Thus, the silver pipe covering the raw material powder was worked into tapes.

Table 8 shows various drafts which were applied to the samples in the above working. The draft is defined as follows:

draft=sectional area of raw material power portion filled up in silver pipe before working/sectional area of raw material powder portion after working into tape.

After such working, all tape-type wires were heat treated at 880° C. for one hour and then at 840° C. for 4 hours, and subjected to measurement of critical current densities in liquid nitrogen. Table 8 also shows the results.

TABLE 8

| | Draft | Critical Current Density (A/cm²) |
|---|---|---|
| 1 | 1 | 200 |
| 2 | 50 | 800 |
| 3 | 80 | 5000 |
| 4 | 90 | 8000 |
| 5 | 120 | 15000 |
| 6 | 150 | 13000 |

Further, tape-type wires were obtained at various drafts in a similar manner to the above, except for that the sample 2 in Experimental Example 1 was employed.

Table 9 shows critical current densities of the as-formed tape-type wires in liquid nitrogen.

TABLE 9

| | Draft | Critical Current Density (A/cm²) |
|---|---|---|
| 1 | 1 | 150 |
| 2 | 50 | 700 |
| 3 | 80 | 4000 |
| 4 | 90 | 6500 |
| 5 | 120 | 12000 |
| 6 | 150 | 12000 |

It is understood from Tables 8 and 9 that critical current densities of the as-formed superconducting wires were improved in the samples which were worked at drafts of at least 75 so that the sectional areas of the raw material powder portions in the metal sheaths were reduced to be not more than 1/75 of those before working, as compared with the remaining samples.

EXPERIMENTAL EXAMPLE 6

Sintered pellets for thallium oxide superconductors were obtained from the powder of the sample 1 in Experimental Example 1.

The sintered pellets were pulverized and filled up in silver pipes, which in turn were worked into tapes until superconductor portions were brought into thicknesses shown in Table 10. Thereafter the as-formed tape-type wires were subjected to heat treatment at 880° C. for one hour and then at 840° C. for 4 hours, and subjected to measurement of critical current densities in liquid nitrogen. Table 10 also shows the results.

TABLE 10

| | Thickness (μm) | Critical Current Density (A/cm²) |
|---|---|---|
| 1 | 300 | 200 |
| 2 | 200 | 4000 |
| 3 | 100 | 14000 |
| 4 | 50 | 15000 |

Further, thallium oxide superconducting wires comprising superconductors having thicknesses shown in Table 11 were obtained in a similar manner to the above, except for that the powder of the sample 2 in Experimental Example 1 was employed. Table 11 also shows critical current densities of the superconducting wires.

TABLE 11

| | Thickness (μm) | Critical Current Density (A/cm²) |
|---|---|---|
| 1 | 300 | 150 |
| 2 | 200 | 3500 |
| 3 | 100 | 12000 |
| 4 | 50 | 12000 |

Referring to each of Tables 10 and 11, the sample No. 1 is according to comparative example, and the samples Nos. 2, 3 and 4 are according to embodiments of the invention. Comparing the sample No. 1 with the samples Nos. 2 to 4, it is understood that the critical current densities of the superconducting wires were remarkably improved when the thicknesses of the thallium oxide superconductors were not more than 200 μm.

EXPERIMENTAL EXAMPLE 7

The powder samples 1 and 2 of Experimental Example 1 were further sintered, to obtain sintered pellets for thallium oxide superconductors.

The sintered pellets were pulverized and filled up in metal sheaths shown in Tables 12 and 13. In each of Tables 12 and 13, symbol "Ag" indicates a metal sheath which is entirely made of silver, symbol "Ag/SUS" indicates a metal sheath having a two-layer structure formed by an inner layer of silver and an outer layer of stainless steel, and symbol "Ag/Ni" indicates a metal sheath having a two-layer structure formed by an inner layer of silver and an outer layer of nickel. In each of the two-layer metal sheaths, the ratio of the inner layer to the outer layer was selected to be 1:3 in thickness.

TABLE 12

| | Critical Current Density (A/cm²) | |
|---|---|---|
| Metal Sheath | Sample 1 | Sample 2 |
| Ag | 10500 | 8500 |
| Ag/SUS | 15000 | 12000 |
| Ag/Ni | 13500 | 10500 |

The metal sheaths were then worked into tapes, which in turn were exposed to loads with a press, heat treated, and subjected to measurement of critical current densities in liquid nitrogen. Table 12 also shows the results.

Table 13 shows tensile strength values of the as-formed tape-type wires.

TABLE 13

| Metal Sheath | Tensile Strength ($\times 10^8$ N/m$^2$) | |
| --- | --- | --- |
| | Sample 1 | Sample 2 |
| Ag | 2.0 | 2.0 |
| Ag/SUS | 8.0 | 7.5 |
| Ag/Ni | 6.0 | 6.0 |

It is understood from Tables 12 and 13 that the critical current densities and strength values were improved when the metal sheaths were provided in composite structures.

What is claimed is:

1. A method of preparing a thallium oxide superconductor, comprising the steps of:

providing a thallium oxide raw material powder;

providing a sheath of metal from the group consisting of silver and silver alloy;

sintering said thallium oxide raw material powder, thereby providing a thallium oxide superconductive material;

filling said sheath with said thallium oxide superconductive material thereby providing a wire;

deforming said wire into a tape consisting of said thallium oxide superconductive material surrounded by said metal;

performing a first heat treatment on said thallium oxide superconductive material and said metal of said tape at a temperature between about 700° C. and about 920° C., then applying a compressive load to said metal and said thallium oxide superconductive material of said tape; and then performing a second heat treatment on said thallium oxide superconductive material and said metal of said tape at a temperature between about 750° C. and about 870° C., wherein said temperature of said first heat treatment is higher than said temperature of said second heat treatment.

2. A method of preforming a thallium oxide superconductor comprising the steps of:

providing a thallium oxide raw material powder;

providing a metal sheath;

sintering said thallium oxide raw material powder, thereby providing a thallium oxide superconductive material;

filling said sheath with said thallium oxide superconductive material, thereby providing a wire;

applying a first compressive load to said wire, thereby deforming said wire into a tape consisting of said thallium oxide superconductive materials surrounded by said metal;

performing a first heat treatment on said thallium oxide superconductive material and said metal of said tape at a temperature between about 700° C. and about 920° C., then applying a second compressive load to said metal and said thallium oxide superconductive material of said tape, thereby providing said tape with a final thickness; and then performing a second heat treatment on said thallium oxide superconductive material and said metal of said tape at a temperature between about 750° C. and about 870° C., wherein said temperature of said first heat treatment is higher than said temperature of said second heat treatment, and wherein said temperature of said second heat treatment satisfies the following numeral condition:

$$T = 840 + A \times W - 10t$$

where $700 \leq T \leq 880$, $600 \leq A \leq 1000$, W=the amount of millimeters of said final thickness, and t=the amount of hours for which the second heat treatment is performed.

3. The method of claim 2, wherein said temperature of said first heat treatment is between 800° C. and 920° C.

4. The method of claim 2, wherein said temperature of said first heat treatment is between 700° C. and 900° C.

5. The method of claim 2, wherein the applying a second compressive load step includes, applying a compressive load to said metal and said thallium oxide superconductive material of said tape such that application of this compressive load results in said thallium oxide superconductive material having a thickness that is about 20% to 80% of said final thickness.

6. The method of claim 2, wherein said metal sheath is of a metal from the group consisting of gold, a gold alloy, silver and a silver alloy.

7. The method of claim 2, wherein said metal sheath comprises an inner member of a noble metal surrounded by an outer member of a metal that is stronger than said noble metal.

8. The method of claim 7, wherein said noble metal is from the group consisting of gold, a gold alloy, silver and a silver alloy.

9. The method of claim 7, wherein said outer member is of a metal from the group consisting a stainless steel and nickel.

10. The method of claim 2, and further comprising the step of cooling said thallium oxide superconductive material of said tape at a rate of at least 20° C./min after the step of performing a first heat treatment and before the step of applying a second compressive load.

11. The method of claim 2, wherein said second compressive load is at least 5 t/cm$^2$.

12. The method of claim 2, wherein said wire has an outer diameter, and wherein the step of applying a first compressive load includes deforming said wire into a tape having a thickness that is not more than 1/5 of said outer diameter.

13. The method of claim 12, wherein the step of applying a first compressive load includes one of drawing, rolling and press working said wire.

* * * * *